US007916754B2

(12) United States Patent
Valadon

(10) Patent No.: US 7,916,754 B2
(45) Date of Patent: Mar. 29, 2011

(54) DATA STREAM RECOVERY

(75) Inventor: Cyril Gregoire Fabrice Valadon, Hertfordshire (GB)

(73) Assignees: MStar Semiconductor, Inc. (KY); MStar Software R&D, Ltd., Shenzhen (CN); MStar France SAS, Issy les Moulineaux (FR); MStar Semiconductor, Inc. (TW)

( * ) Notice: Subject to any disclaimer, the term of this patent is extended or adjusted under 35 U.S.C. 154(b) by 809 days.

(21) Appl. No.: 11/568,799

(22) PCT Filed: May 13, 2005

(86) PCT No.: PCT/EP2005/052211
§ 371 (c)(1),
(2), (4) Date: Nov. 7, 2006

(87) PCT Pub. No.: WO2005/119929
PCT Pub. Date: Dec. 15, 2005

(65) Prior Publication Data
US 2007/0233890 A1    Oct. 4, 2007

(30) Foreign Application Priority Data

Jun. 3, 2004  (EP) .................................. 04253298

(51) Int. Cl.
*H04J 3/00* (2006.01)
*H04J 3/16* (2006.01)
(52) U.S. Cl. ........................................ 370/476; 370/472
(58) Field of Classification Search .................. 370/335, 370/472, 476; 709/231
See application file for complete search history.

(56) References Cited

U.S. PATENT DOCUMENTS

| 6,624,767 | B1 * | 9/2003 | Shiu et al. | 341/81 |
| 6,798,826 | B1 * | 9/2004 | Shiu et al. | 375/147 |
| 7,187,708 | B1 * | 3/2007 | Shiu et al. | 375/148 |
| 7,376,438 | B2 * | 5/2008 | Shiu et al. | 455/522 |
| 7,385,949 | B1 * | 6/2008 | Botha | 370/329 |
| 7,463,702 | B2 * | 12/2008 | Ammer et al. | 375/341 |
| 2001/0021229 | A1 * | 9/2001 | Belaiche | 375/295 |
| 2002/0009061 | A1 * | 1/2002 | Willenegger | 370/328 |
| 2003/0036403 | A1 * | 2/2003 | Shiu et al. | 455/522 |
| 2003/0152043 | A1 * | 8/2003 | Geers | 370/314 |
| 2004/0085989 | A1 * | 5/2004 | Boumendil et al. | 370/442 |

FOREIGN PATENT DOCUMENTS

WO    WO 02/30000 A2    4/2002

* cited by examiner

*Primary Examiner* — Derrick W Ferris
*Assistant Examiner* — Matthew Hopkins
(74) *Attorney, Agent, or Firm* — Edell, Shapiro & Finnan, LLC

(57) ABSTRACT

A method and processor for recovering a plurality of individual data streams from a composite data stream The composite data stream having been formed by first bit reordering the individual data streams with respect to themselves, combining the individual data streams and second bit reordering the combined individual data streams to form the composite data stream. The processor is arranged to for a current bit position in the composite data stream perform the steps of: (a) applying an inverse of the second bit reordering; (b) identifying to which individual data stream the current bit belongs; (c) storing the current bit in a memory space allocated to the identified individual data stream wherein the current bit is positioned within the memory space according to the first bit reordering; and performing steps (a) to (c) for each bit position in the composite data stream.

3 Claims, 7 Drawing Sheets

DATA STREAM RECOVERY

BACKGROUND OF THE INVENTION

The present invention relates to a data recovery method and processor. More particularly, the invention relates to a method of recovering data at a receiver which has been interleaved and sent by a transmitter.

Wireless communication systems make use of bit re-ordering techniques, also known as interleaving, in order to improve the performance of the transmission link. If the signal received has been affected by a sequence or burst of erroneous symbols, the use of an interleaving mechanism will spreads these errors across the whole stream of received data and thus make it easier for the receiver to successfully recover the transmitted information. At the receiver it is required to re-arrange the bits, according to their original order so that further processing of the data can be correctly performed.

In an interleaving mechanism, at a transmitter, a sequence of bits to be transmitted $x_1, x_2, \ldots, x_N$ is interleaved/reordered according to the permutation $\gamma$ such that the sequence $x_{\gamma(1)}, x_{\gamma(2)}, \ldots, x_{\gamma(N)}$ is transmitted. At the receiver, it is first required to estimate the sequence of transmitted symbols after interleaving. Once, this sequence $\hat{x}_{\gamma(1)}, \hat{x}_{\gamma(2)}, \ldots, \hat{x}_{\gamma(N)}$ has been obtained, the permutation which has been introduced by the transmitter needs to be removed. To re-order the interleaved received sequence and obtain the sequence estimates of the transmitted information $\hat{x}_{(1)}, \hat{x}_{(2)}, \ldots, \hat{x}_{(N)}$ the complete sequence needs to be stored in memory.

Communication systems that provide multimedia services need to be able to combine/multiplex data streams coming from different service sources (for example one possible source can be associated with a speech signal and a second source could correspond to packet data). The receiver then needs to separate these different data streams so that they can be processed adequately.

In a conventional Universal Mobile Telecommunications System (UMTS), the information data streams of different transport channels (TrCHs) are coded and combined together by the transmitter in order to be transmitted using a number of physical channels (PhCHs). Different transport channels can be used in order to transmit different types of information.

The information of each TrCH is first interleaved with respect to itself before all of the TrCHs are combined/multiplexed together. When the TrCHs have been multiplexed, DTX (discontinuous transmission) bits may be added to the multiplexed data stream. The DTX bits are added to the stream of data to be transmitted when the number of bits from the combination of the TrCHs is less than the number of bits available in the physical channels (PhCHs) for transmission. These bits are sent by the transmitter with a power of zero in order to reduce interference levels to other users in the system. Hence, they don't provide the receiver with any useful information on the transmitted data and can be removed from the processing chain. The multiplexed data is then interleaved according to a secondary interleaving with a particular permutation.

The receiver must be capable of removing both stages of interleaving and separating the DTX from the data stream.

A conventional receiver works as follows:
Step 1
Estimates $\hat{v}(1), \hat{v}(2), \ldots, \hat{v}(P)$ of a sequence of bits transmitted by the transmitter $v(1), v(2), \ldots, v(P)$ are received and stored in a buffer.
Step 2
Using the values $\hat{v}(1), \hat{v}(2), \ldots, \hat{v}(P)$ stored in the buffer, the effect of the bit reordering introduced by the permutation can be removed. The resulting sequence $\hat{u}(1), \hat{u}(2), \ldots \hat{u}(P)$ of estimates of the transmitted sequence $u(1), u(2), \ldots u(P)$ are stored in a buffer. Note that this buffer needs to be different from the buffer used in the first step and that this buffer will contain the received version of the DTX bits sent by the transmitter.
Step 3
The receiver must then processes the data corresponding to each transport channel in turn. The receiver will first go through the section in the buffer defined in step 2 corresponding to the first TrCH and will remove the bit re-ordering introduced by the transmitter. The re-ordered bits of each TrCH are then stored in a third memory buffer. The DTX bits are removed during this processing stage. Note that this final buffer needs to be large enough to store the received data stream of the different transport channels for the different frames which cover a full TTI. Note as well, that this third memory buffer is shared between the different TrCHs. This procedure needs to be repeated for every received frame (i.e. every 10 ms in a UMTS system).

When multiple interleaving schemes as described above are used the conventional receivers require a separate memory space for each stage of bit-reordering. This is very memory intensive. Conventional receivers such as these, i.e. those that require a separate memory for each stage, are disclosed in U.S. Pat. No. 6,624,767 and WO 02/30000.

SUMMARY OF THE INVENTION

An object of the present invention is to reduce the amount of memory space required by a multiple interleaving scheme.

According to a first aspect of the present invention there is provided a method of recovering a plurality of individual data streams from a composite data stream, the composite data stream having been formed by first bit reordering the individual data streams with respect to themselves, combining the individual data streams and second bit reordering the combined individual data streams to form the composite data stream, the method comprising;
for a current bit position in the composite data stream performing the steps of:
(a) applying an inverse of the second bit reordering;
(b) identifying to which individual data stream the current bit belongs;
(c) storing the current bit in a memory space allocated to the identified individual data stream wherein the current bit is positioned within the memory space according to the first bit reordering; and
performing steps (a) to (c) for each bit position in the composite data stream.

An advantage of the present invention is that a single memory space is required to perform multiple stage of bit reordering.

The method may also comprise the step of adding first DTX bits to the data stream prior to the first bit reordering. The first DTX bits may then be removed from the data stream between steps (b) and (c).

Secondary DTX bits may be added to the data stream after the combining the individual data. The secondary DTX bits may then be removed from the data stream between steps (b) and (c).

According to a second aspect of the present invention there is provided a processor for recovering a plurality of individual data streams from a composite data stream, the composite data stream having been formed by first bit reordering the individual data streams with respect to themselves, combining the individual data streams and second bit reordering the combined individual data streams to form the composite data stream, the being processor arranged:

for a current bit position in the composite data stream, to perform the steps of:
(a) applying an inverse of the second bit reordering;
(b) identifying to which individual data stream the current bit belongs;
(c) storing the current bit in a memory space allocated to the identified individual data stream wherein the current bit is positioned within the memory space according to the first bit reordering; and
to perform steps (a) to (c) for each bit position in the composite data stream.

The invention may also include a receiver including a processor as defined above.

BRIEF DESCRIPTION OF DRAWINGS

One example of a processor and process according to the invention will now be described with reference to the accompanying drawings, in which.

DESCRIPTION OF THE INVENTION

Figure 1:
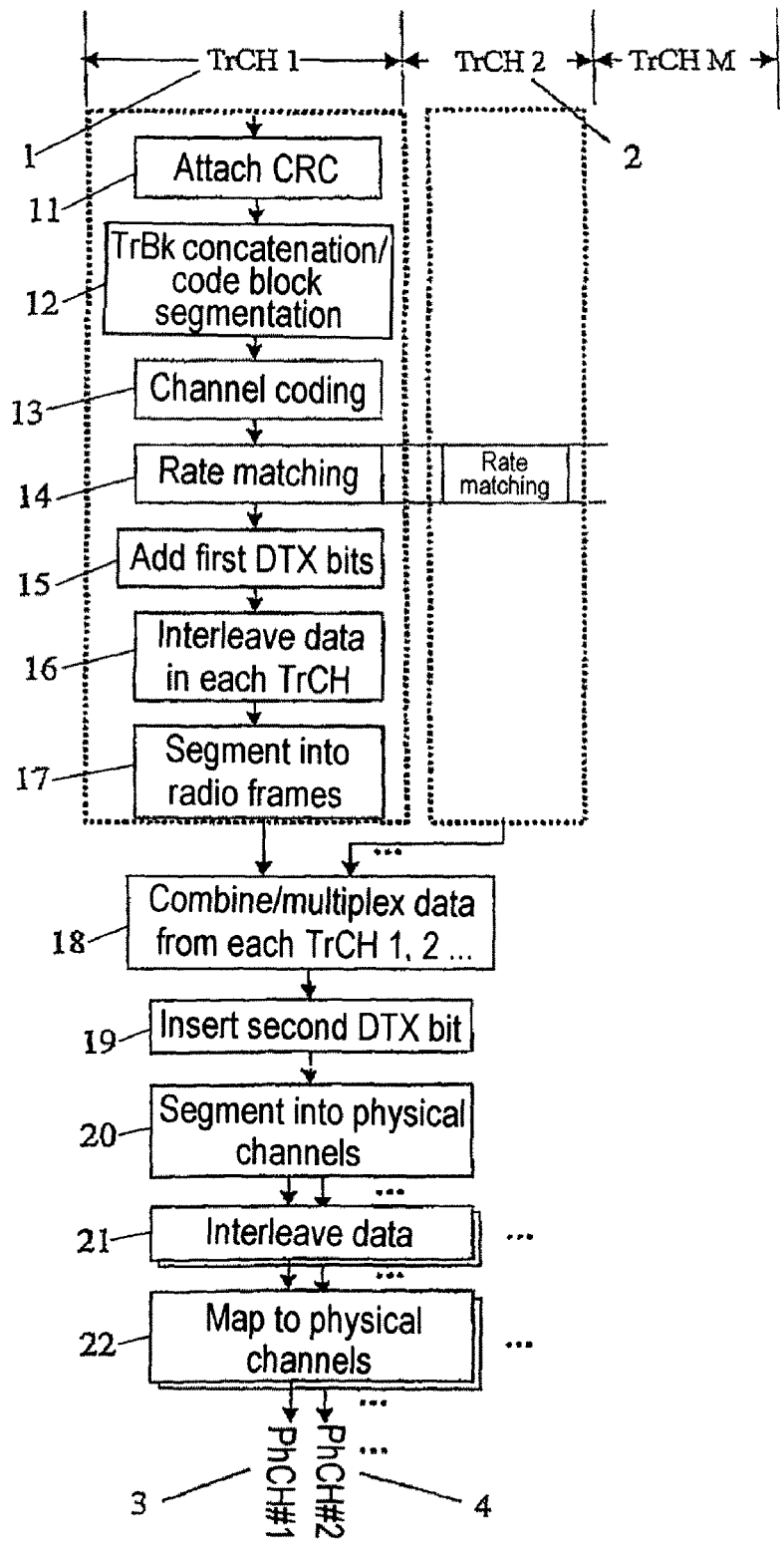
FIG. 1 shows the data processing in a transmitter.

FIG. 1 describes the different signal formatting stages performed by a base station (or Node B) in the UMTS standards. The information data streams of a number of different transport channels (TrCHs) 1, 2, ... M are coded and combined together in order to be transmitted using a number of physical channels (PhCHs). Different transport channels can be used in order to transmit different types of information.

The data to be transmitted in each TrCH go through a number of steps before all of the TrCHs are multiplexed together. At step 11, a CRC (Cyclic Redundancy Check) is attached to the data bits in each channel. At step 12 TrBk concatenation/code block segmentation takes place. Channel coding and rate matching takes place at steps 13 and 14 respectively. At step 15 first DTX bits may be added to the data; this is explained in more detail below. The data are then interleaved in each TrCh at step 16 and segmented into radio frames at step 17.

The data from each TrCh 1, 2, . . . are combined/multiplexed at step 18 prior to a second DTX bit insertion at step 19. The data are then segmented into a number of physical channels at step 20. These data are then interleaved at step 21 before they are mapped onto physical channels, step 22. The data are then transmitted on PhCHs 3 and 4.

The processing stages up to and including 'radio frame segmentation' 17, are performed independently for the different TrCHs. The rate at which these processing stages are performed can vary with the different transport channels. For example, in the UMTS these processes can be repeated every 10, 20, 40 or 80 ms depending on the type of information being transferred. The rate at which the information of the different TrCHs is processed is referred to as Transport Time Interval (TTI). The processing stages from and including 'TrCH multiplexing' 18 are performed regularly (every 10 ms frame) and operate on the aggregated data stream from all the TrCHs.

It can be seen from FIG. 1 that the signal formatting includes two stages of bit reordering '$1^{st}$ interleaving' (step 16) and '$2^{nd}$ interleaving' (step 21) as well as a processing stage aimed at combining the coded data elements from the different TrCHs into a single data stream 'TrCH multiplexing' (step 18). On the receiver side, it's required that the inverse of the bit-reordering and combining stages is performed. The bit-reordering is removed by de-interleaving the received data. A de-multiplexing stage is required in order to separately recover the data associated with each TrCH from the combined data stream.

Figure 2:
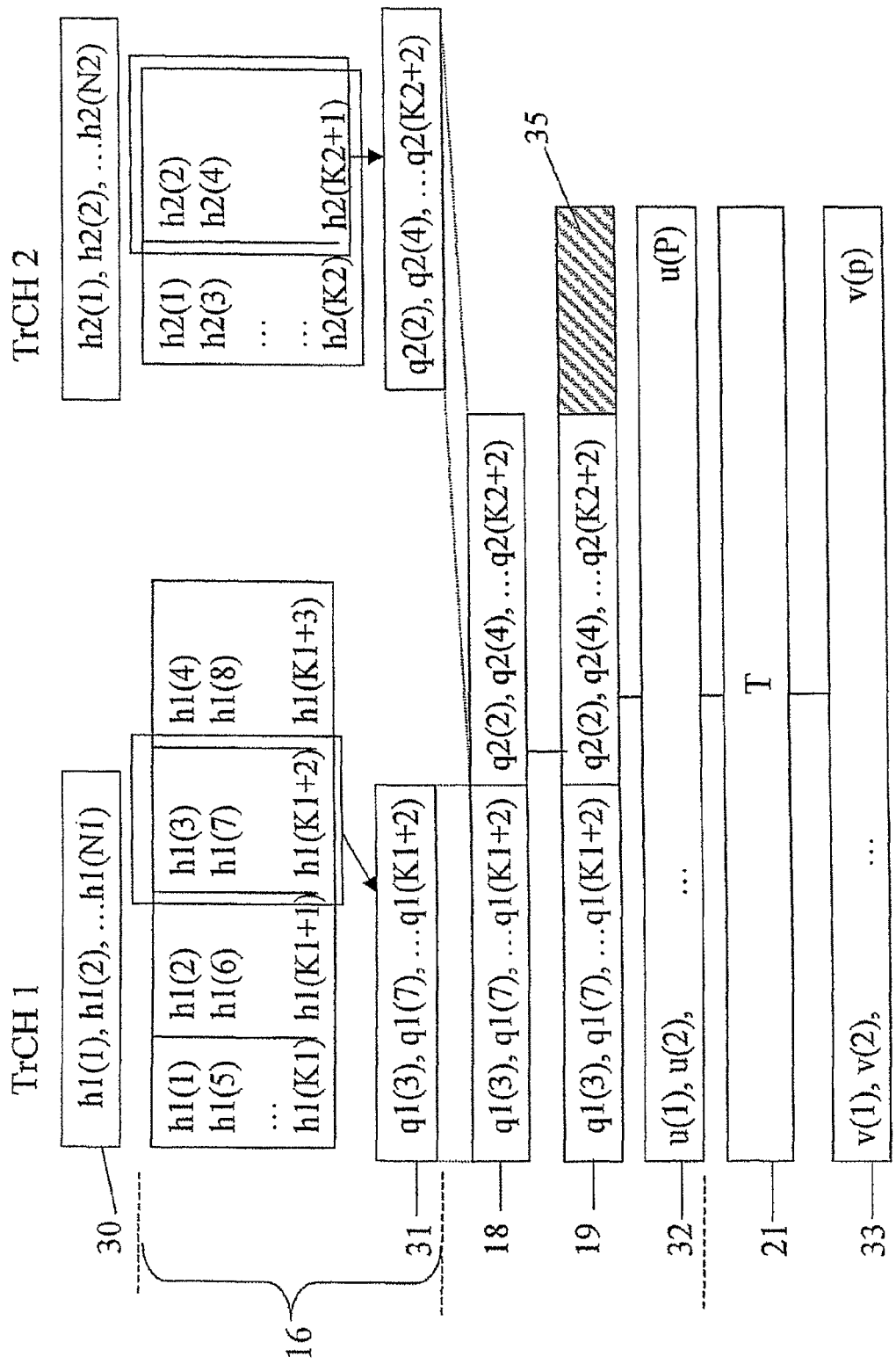
FIG. 2 shows in more detail the data processing in the transmitter.

FIG. 2 shows, in more detail, the different interleaving and TrCH multiplexing stages performed on the signal to be transmitted. For illustration, two TrCHs with 10 ms and 40 ms TTI respectively have been selected. In order to improve clarity, it is assumed that the data sequence is transmitted on a single physical channel and as a result the "physical channel segmentation" stage 20 has been omitted, although multiple PhCHs may be used.

For TrCH i (i=channel index), data 30 consists of N bits, hi(1), hi(2), . . . ,hi(Ni), where h is the data bit. These data are interleaved (step 16) into a number of frames 31 each consisting of K bits. The interleaved frame 31 contains the data:

q1(3), q1(7), . . . ,q1(K1+2)

for the third frame of the first transport channel.

In step 18 the frames from each TrCH are multiplexed together. Following the TrCH multiplexing stage 18, secondary DTX bits 35 may be added in step 19. These bits are added to the stream of data to be transmitted when the number of bits from the combination of the TrCHs is less than the number of bits available in the PhCHs. The resulting data stream 32 is represented as:

u(1), u(2), . . . ,u(P)

P is equal to the number of bits which are transmitted on the physical channel. As secondary DTX bits may be included in the data stream:

$$\sum_{i}^{M} K(i) \le P$$

where M is the total number of TrCHs which are multiplexed. K(i) corresponds to the number of bits from the transport channel with index i transmitted during one frame on the physical channel.

In step 21, the second interleaving stage, a permutation T is applied to the data sequence. T is a bijection function operating from the integer space {1, . . . ,P} into the integer space {1, . . . ,P} (Its inverse is noted as $T^{-1}$.) The resulting sequence 33:

v(1), v(2), . . . ,v(P)

is transmitted on the PhCH.

Figure 3:
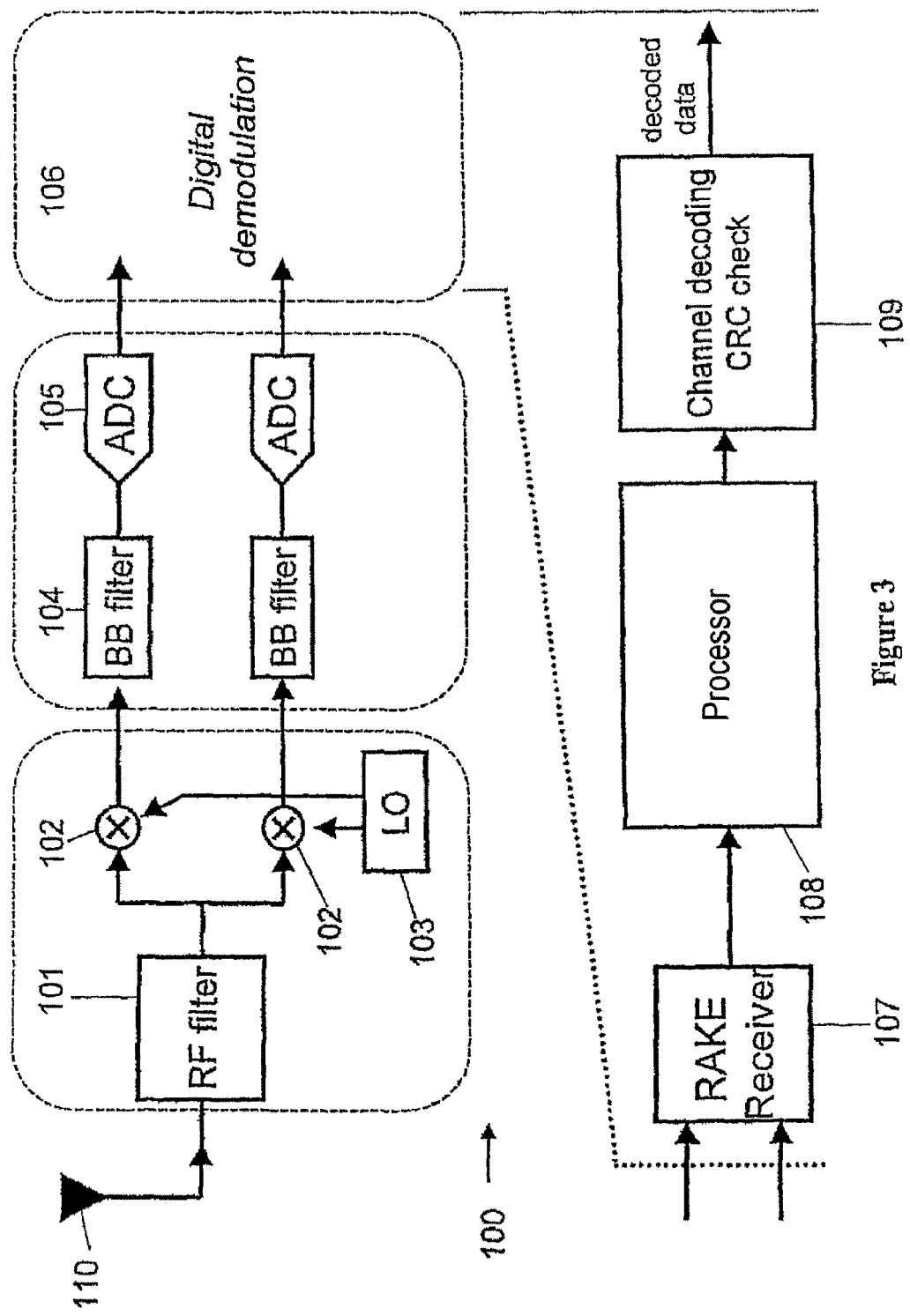
FIG. 3 is a schematic of the components of a receiver.

FIG. 3 displays schematically the components of a receiver 100 used in UMTS. The interleaved data (v(1), v(2), . . . ,v(P)) sent by the transmitter are received by an antenna 110, which is connected to an RF filter 101. The electrical signal from the RF filter 101 is converted to a base-band signal using a frequency reference provided by a local oscillator (LO) 103 and mixers 102. The resulting analog signal is then converted to a digital signal using base-band (BB) filters 104 and analog-todigital converters (ADC) 105. A demodulation block 106 includes a rake receiver 107, a deinterleaving unit 108 and a channel decoding/CRC check unit 109. The digital signal is passed to the rake receiver 107. The soft decisions from the rake receiver 107 are then passed to module 108 which contains a processor arranged to operate as defined above. The Module 108 deinterleaves the interleaved signal received from the transmitter. The signal is then passed to module 109 which decodes each transport channel and completes the CRC check.

The processing performed by module 8 of the receiver 100 will now be described for the reception of a frame of data.

Step 1

For the $k^{th}$ received estimate of the data transmitted on the PhCH, $\hat{v}(k)(1<=k<=P)$, the inverse permutation of the current bit position $T^{-1}(k)$ is calculated. Since these computations will be the same for each frame, they could be stored rather than being generated on-the-fly. Moreover, the received data estimates can be processed one-by-one as they are received rather than being stored until a complete frame has been received.

Step 2

Then the following computation is performed in order to identify which transport channel the current data estimate belongs to:

```
TrCHIndex = 1
LastTrCHPosition = K(1)
ttiMemoryOffset = T⁻¹(k)
while (TrCHIndex <= M) and (T⁻¹(k) > lastTrCHPosition)
    TrCHIndex = TrCHIndex + 1
    ttiMemoryOffset = ttiMemoryOffset − lastTrCHPosition
    LastTrCHPosition = lastTrChPosition + K(TrCHIndex)
end
```

At the end of this computation, it is possible to determine if the data estimate which is being processed is a $2^{nd}$ DTX bit or not. If $T^{-1}(k)>$lastTrCHPosition the current data estimate is a $2^{nd}$ DTX bit. In this case, the sample is discarded and no further processing is performed with it. Note that those samples are discarded before they are stored in memory. Hence, the presence of those $2^{nd}$ DTX bits does not increase the memory requirements of the receiver. If the sample being processed does not correspond to a $2^{nd}$ DTX bit, then it needs to be stored.

Step 3

Using the computations performed during step 2, it is known that the sample being processed belongs to the TrCH with index equal to TrCHIndex. Hence, the computations performed in step 2 allow the simultaneous removal of the bit re-ordering introduced by the $2^{nd}$ interleaving stage, the identifying and discarding of the $2^{nd}$ DTX bits and the identifying of the transport channel to which the sample belongs. Once the transport channel identity of the current sample has been identified, the sample is stored in the memory space allocated to the given transport channel. Note that this memory space will be of the same size as the memory used in a conventional receiver for the $3^{rd}$ operation. This memory space is referred to as TTI memory.

The position where the sample will be located within the memory space allocated to the given TrCH can be adapted to the specific $1^{st}$ interleaving scheme being used by the communication systems. For example, in UMTS where the $1^{st}$ bit re-ordering stage is based on a block interleaving algorithm, the samples belonging to the same radio frame can be put in consecutive spaces. For example, for TrCHi, the bits from the first frame will be put in locations with indices varying from 1 to K(i), the samples from the second frame will be located in locations K(i)+1 to 2* K(i), etc.

Figure 4:
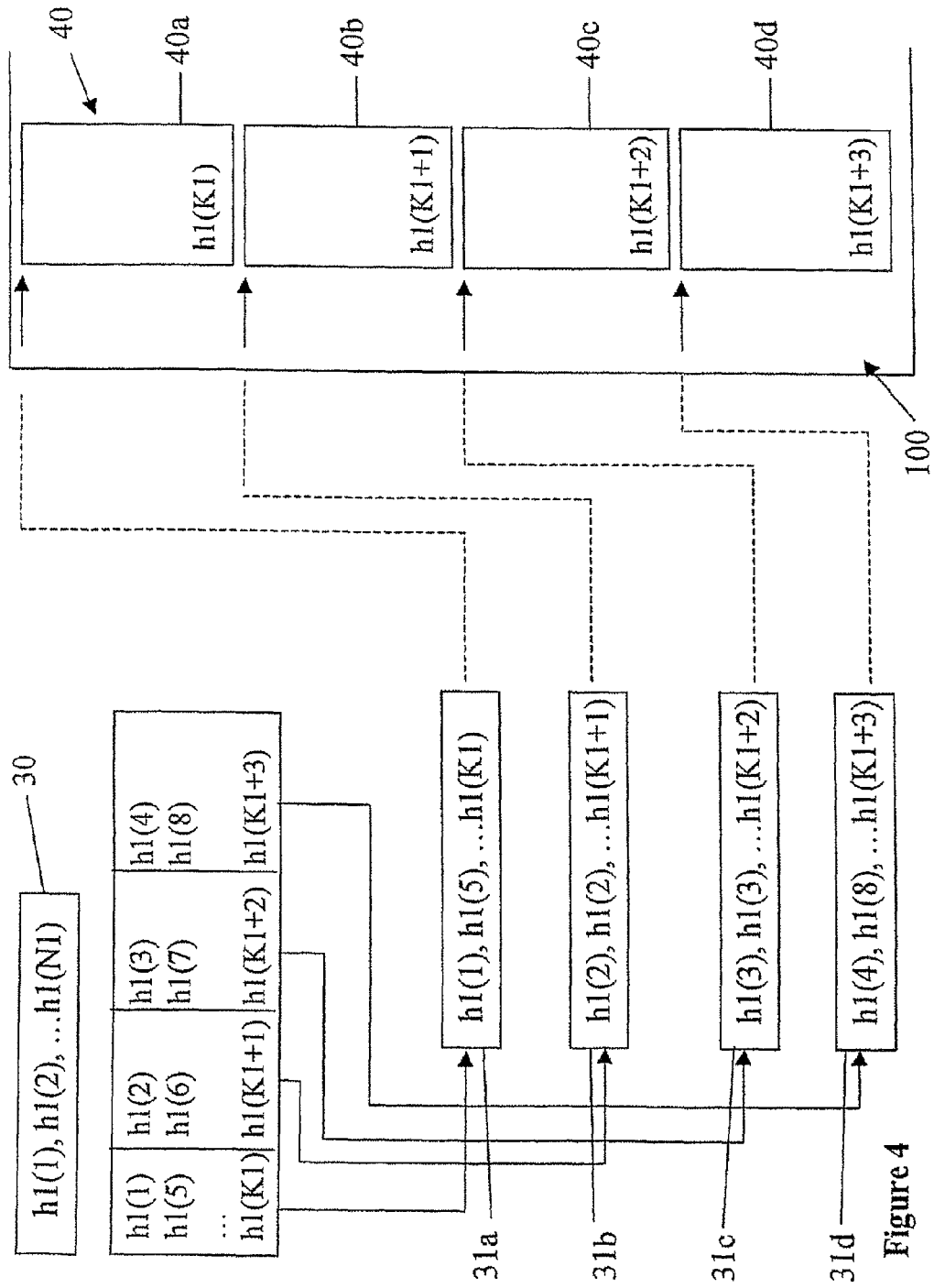
FIG. 4 shows the organisation of the memory in the receiver.

FIG. 4 illustrates the bit re-ordering performed by the $1^{st}$ interleaving stage defined in UMTS for a TrCH with a 40 ms TTI and describes one possible arrangement in the receiver 100 for storing the data in the TTI memory 40. As described above, the data 30 are interleaved into a number of frames, shown in FIG. 4 as 31*a*, 31*b*, 31*c* and 31*d*. These frames are then transmitted to the receiver 100 (illustrated by the dashed lines). The bits from each frame are stored in particular locations 40*a*, 40*b*, 40*c*, and 40*d* in the TTI memory 40. Note that this is only one of a number of possible memory organisations. It would, for example, be possible to design a memory arrangement of the TTI buffer which would take into account any inter-column permutation introduced by the transmitter.

The effect of the first bit re-ordering stage will then be removed when the data samples are read from the TTI memory for further processing (rate matching for example in the UMTS).

The system can be extended to efficiently cope with variations in the way the first interleaving processing is done. For example, in UMTS DTX bits can also be introduced during the first interleaving stage. This processing stage, referred to as $1^{st}$ DTX bit insertion, allows control of the number of DTX bits to be inserted across the whole TTI. The $1^{st}$ DTX bit insertion is depicted in FIG. 5.

Figure 5:
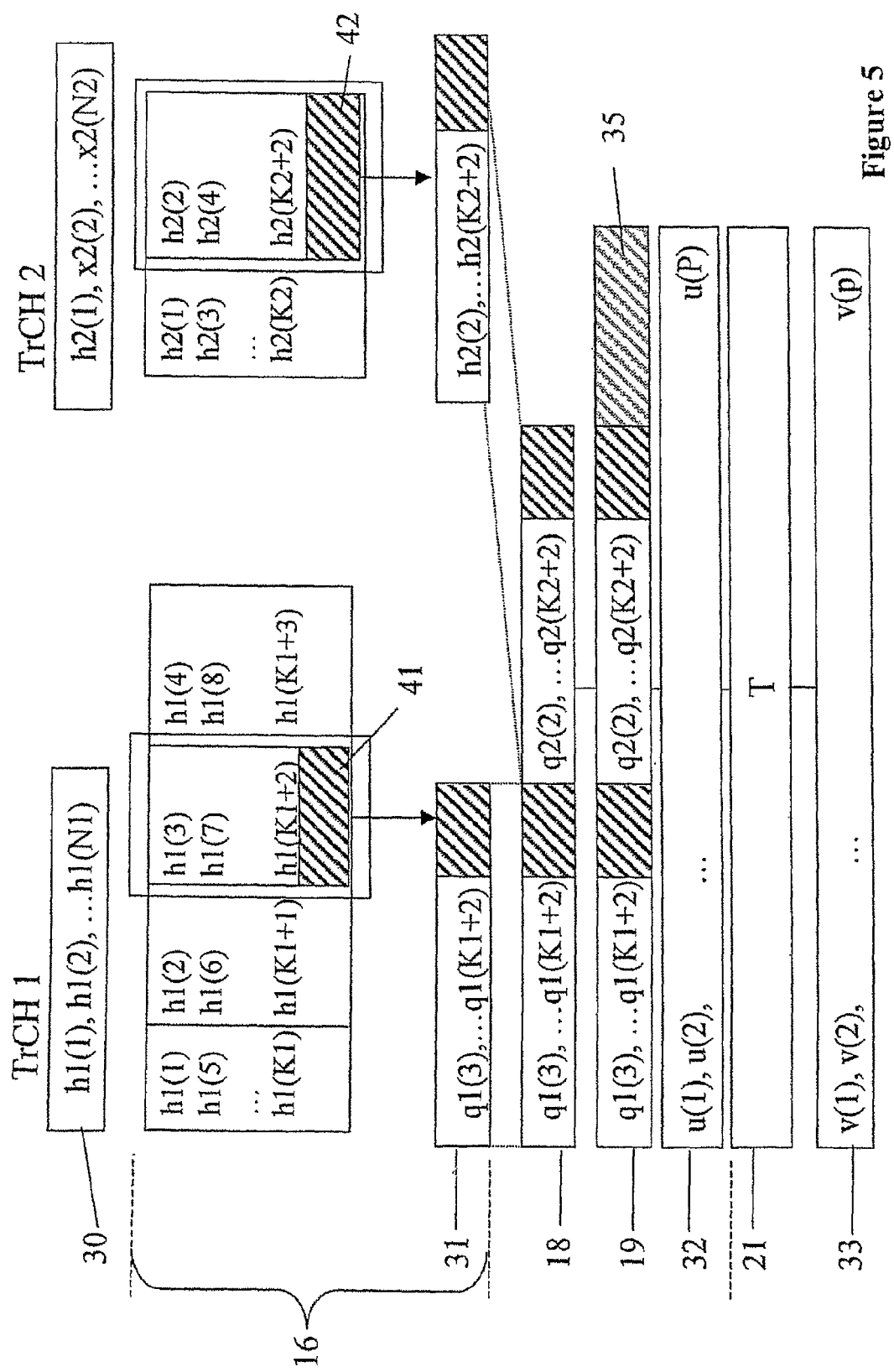
FIG. 5 shows the insertion of first DTX bits.

Similar references in FIG. 5 correspond to the references in FIG. 2. The number of $1^{st}$ DTX bits 41 and 42 inserted for each TrCH can vary with every frame. The total number of bits across the whole TTI associated with TrCH i is equal to N(i). The number of bits, excluding $1^{st}$ DTX bits, to be transmitted by TrCH i during a particular frame f is equal to K(i, f). The number of $1^{st}$ DTX bits introduced in frame f in the data stream of TrCH i is equal to:

$$\left(\frac{N(i)}{F(i)}\right) - k(i, f)$$

This number will be denoted as D(i, f).

Similarly to the processing done with the $2^{nd}$ DTX bits 35, the invention allows the $1^{st}$ DTX bits 41, 42 to be discarded before there is any need for them to be stored. When $1^{st}$ DTX bits 41, 42 are present in the formatted data stream, step 2 of the invention can be modified as follows:

Step 2

```
TrCHIndex = 1
LastTrCHPosition = K(1, f)
LastTrChPositionWithDtx = K(1, f) + D(1, f)
ttiMemoryOffset = T⁻¹(k)
while (TrCHIndex <= M) and (T⁻¹(k) > lastTrCHPositionWithDtx)
    TrCHIndex = TrCHIndex + 1
    ttiMemoryOffset = ttiMemoryOffset − lastTrCHpositionwithDTx
    LastTrCHPosition =lastTrChPosition
                    + K(TrChIndex, f)
                    + D(TrCHIndex − 1, f)
    LastTrChPositionWithDtx = lastTrChPositionWithDtx
                    + K(TrChIndex, f)
                    + D(TrChIndex, f)
end
if (T⁻¹(k) > lastTrCHPositionWithDtx)
    discard 2ⁿᵈ DTX sample
else
    if (T⁻¹(k) > LastTrCHPosition)
        discard 1ˢᵗ DTX sample
    end
end
```

Figure 6:
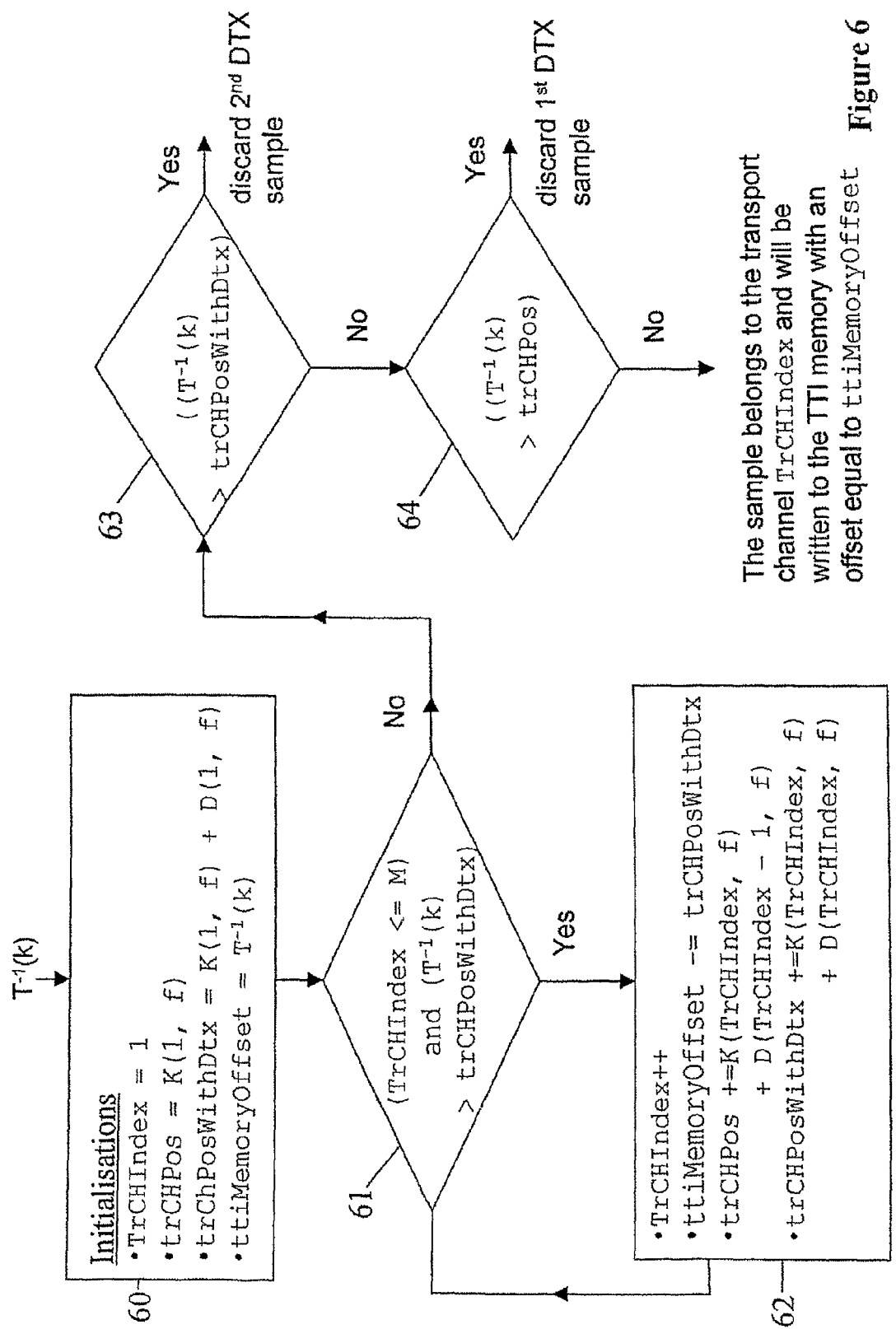
FIG. 6 displays graphically an algorithm used in the receiver.

This algorithm is shown graphically in FIG. 6. At step 60 the variables used for the computations are initialised. These variables include the index of the transport channel which will be tested first as well as the position in the frame of the last received bit for this given TrCH (this includes 1st DTX bits) and the position of the last useful bit for this TrCH (this excludes 1st DTX bits). The location in the TTI memory where the current bit will be written (unless the bit is subsequently found to be a DTX bit) is also initialised. Step 61 checks (1) that the current bit does not belong to the TrCH being tested and (2) that the current TrCH is not the last TrCH to be tested. If both conditions are right, the different variables are updated at step 62 such that the next TrCH can be tested. The TTI memory location for the current bit is also updated.

If at least one of the two conditions is false, the computations of step 63 are performed in order to decide if the current sample is a 2nd DTX bit. If found to be a 2nd DTX bit, then the bit is discarded without being written to the memory. If, however, the bit is not a 2nd DTX bit, the computations of step 64 are performed in order to decide if the bit is a 1st DTX bit. If found to be a 1st DTX bit, the current bit is discarded without being written to memory. If, however, the bit is not a 1st DTX bit, the bit is written in the TTI memory. The value of the variable TrCHIndex indicates which TrCH this bit belongs to. And the variable ttiMemoryOffset indicates the location of the current bit in the section of the TTI memory allocated to the TrCH numbered TrCHIndex.

Figure 7:
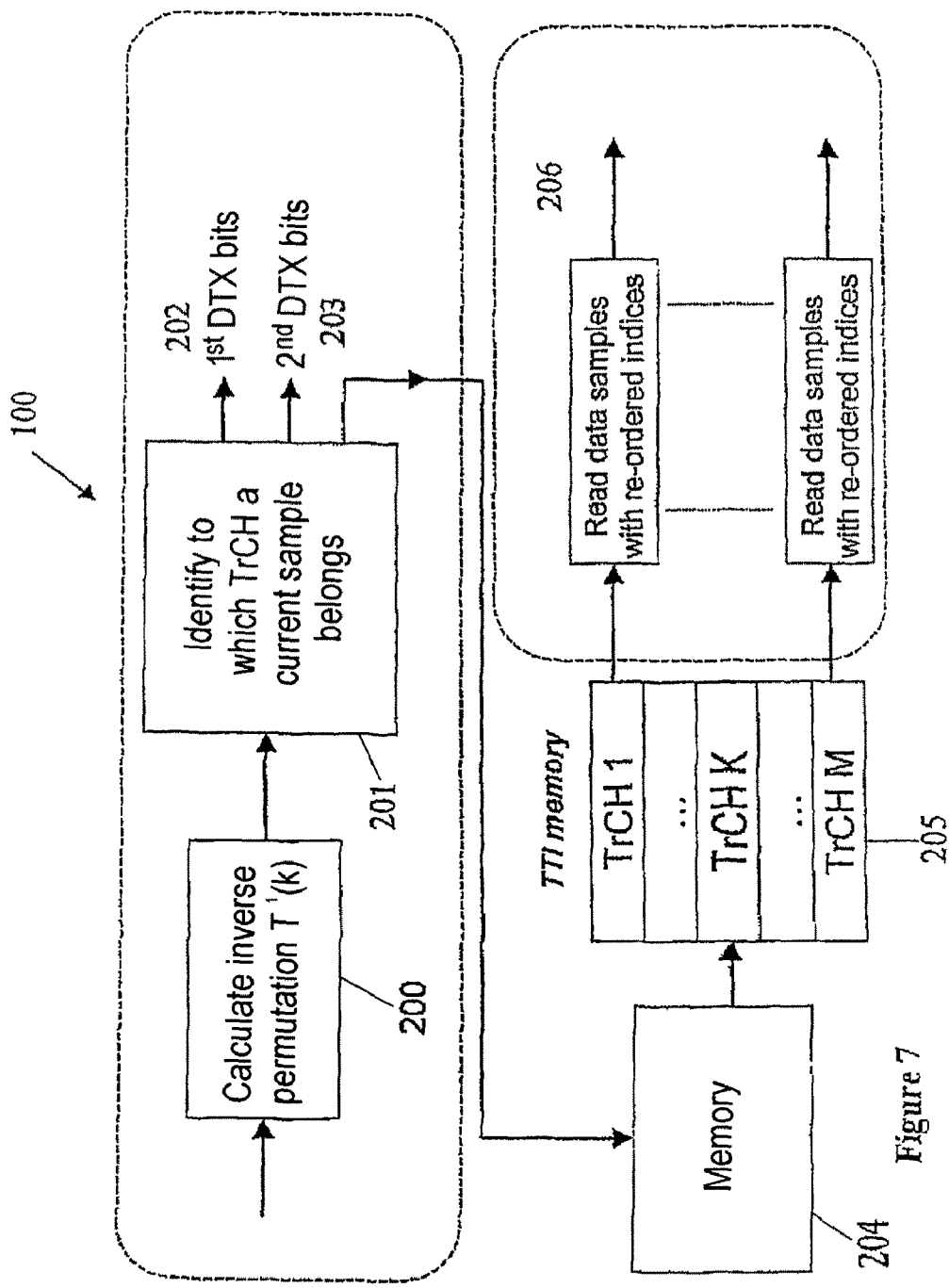
FIG. 7 is a schematic of the processes in the receiver.

FIG. 7 shows a overview of the processes described above. The inverse permutation $T^{-1}(k)$ is calculated at 200, which corresponds to step 1 described above. At 201, the receiver identifies which TrCH a current sample belongs to and it also identifies any $1^{st}$ and $2^{nd}$ DTX bits. The $1^{st}$ and $2^{nd}$ DTX bits are discarded in 203 and 202 respectively. 201, 202 and 203 correspond to step 2 described above.

At 204 each data sample is written in the TTI memory 40. As shown schematically at 205, the data corresponding to each TrCH is stored in a particular location in the TTI memory. The information stored in the TTI memory can then be read at 206 which will have the effect of removing the first bit reordering stage as described above.

The invention claimed is:

1. A method of recovering a plurality of individual data streams from a composite data stream, the composite data stream having been formed by adding first discontinuous transmission (DTX) bits to the individual data streams, first bit reordering the individual data streams with respect to themselves, combining the individual data streams and second bit reordering the combined individual data streams to form the composite data stream, the method comprising;
   (a) receiving a current bit of one of the individual data streams in the composite data stream;
   (b) prior to storing the current bit in a memory space allocated to the one of the individual data streams, applying an inverse of the second bit reordering to identify whether the current bit is a second DTX bit and discarding the current bit without writing the current bit to the memory space if the current bit is the second DTX bit, wherein the second DTX bit is added to the data stream after the combining the individual data streams;
   (c) prior to storing the current bit in the memory space, applying an inverse of the second bit reordering to identify whether the current bit is a first DTX bit and discarding the current bit without writing the current bit to the memory space if the current bit is the first DTX bit;
   (d) storing the current bit in the memory space wherein the current bit is positioned within the memory space according to the first bit reordering; and
   performing steps (a) to (d) for each bit position in the composite data stream.

2. A system for recovering a plurality of individual data streams from a composite data stream, the composite data stream having been formed by adding first discontinuous transmission (DTX) bits to the individual data streams, first bit reordering the individual data streams with respect to themselves, combining the individual data streams and second bit reordering the combined individual data streams to form the composite data stream, the system comprising:
   a receiver to receive a current bit in the composite data stream;
   a memory to selectively store the current bit in a memory space allocated to one of the individual data streams wherein, when stored, the current bit is positioned within the memory space according to the first bit reordering; and
   a processor to apply an inverse of the second bit reordering to identify whether the current bit is one of a first DTX bit and a second DTX bit, and discard the current bit without writing the current bit to the memory space if the current bit is one of the first DTX bit and the second DTX bit, wherein the second DTX bit is added to the data stream after the combining the individual data streams.

3. The system of claim 2, wherein the system is integrated with a cellular telephone handset.

* * * * *